United States Patent
Fleurial et al.

(10) Patent No.: US 9,231,180 B2
(45) Date of Patent: Jan. 5, 2016

(54) NANOSTRUCTURED SILICIDE COMPOSITES FOR THERMOELECTRIC APPLICATIONS

(71) Applicant: California Institute of Technology, Pasadena, CA (US)

(72) Inventors: Jean-Pierre Fleurial, Altadena, CA (US); Sabah K. Bux, Chino Hills, CA (US)

(73) Assignee: California Institute of Technology, Pasadena, CA (US)

( * ) Notice: Subject to any disclaimer, the term of this patent is extended or adjusted under 35 U.S.C. 154(b) by 100 days.

(21) Appl. No.: 14/050,184

(22) Filed: Oct. 9, 2013

(65) Prior Publication Data

US 2014/0097391 A1    Apr. 10, 2014

Related U.S. Application Data (60) Provisional application No. 61/711,387, filed on Oct. 9, 2012.

(51) Int. Cl.
| | |
|---|---|
| *H01L 35/14* | (2006.01) |
| *H01L 35/22* | (2006.01) |
| *H01L 35/34* | (2006.01) |
| *C01B 33/06* | (2006.01) |
| *H01L 35/26* | (2006.01) |

(52) U.S. Cl.
CPC .............. *H01L 35/22* (2013.01); *C01B 33/06* (2013.01); *H01L 35/26* (2013.01); *H01L 35/34* (2013.01)

(58) Field of Classification Search
CPC ................................ H01L 35/22; H01L 35/34
See application file for complete search history.

(56) References Cited

U.S. PATENT DOCUMENTS

| | | | |
|---|---|---|---|
| 2011/0088739 A1* | 4/2011 | Zinn et al. | 136/205 |
| 2011/0100409 A1* | 5/2011 | Kim et al. | 136/205 |
| 2011/0139208 A1* | 6/2011 | Lee et al. | 136/236.1 |
| 2013/0269739 A1* | 10/2013 | Hwang et al. | 136/205 |

FOREIGN PATENT DOCUMENTS

WO    WO 2010/004360    *    1/2010

OTHER PUBLICATIONS

Scoville, N., et al., "Thermal Conductivity Reduction in SiGe Alloys by the Addition of Nanophase Particles," Nanostructured Materials, 1995, vol. 5, No. 2, pp. 207-223.

Faleev, S. And Leonard, F., "Theory of Enhancement of Thermoelectric Properties of Materials with Nanoinclusions," Physical Review B, 2008, vol. 77, No. 214304, 9 pages.

Bux, S., et al., "Nanostructured Bulk Silicon as an Effective Thermoelectric Material," Advanced Functional Materials, 2009, vol. 19, pp. 2445-2452.

Mingo, N., et al., "Nanoparticle-in-Alloy Approach to Efficient Thermoelectrics: Silicides in SiGe," NanoLetters, 2009, vol. 9, No. 2, pp. 711-715.

Bux, S., et al., "Nanostructured Silicon-Based Composites for High Temperature Thermoelectric Applications," Materials Research Society, Symposium Proceedings, 2010, vol. 1267, 6 pages.

* cited by examiner

*Primary Examiner* — Carol M Koslow
(74) *Attorney, Agent, or Firm* — Kilpatrick Townsend & Stockton LLP (57)    ABSTRACT

The present invention provides a method of preparing a nanocomposite thermoelectric material. The method includes heating a reaction mixture of a semiconductor material and a metal complex to a temperature greater than the decomposition temperature of the metal complex. The heating forms metallic inclusions having a size less than about 100 nm that are substantially evenly distributed throughout the semiconductor material forming the nanocomposite thermoelectric material. The present invention also provides a nanocomposite thermoelectric material prepared by this method.

18 Claims, 4 Drawing Sheets

NANOSTRUCTURED SILICIDE COMPOSITES FOR THERMOELECTRIC APPLICATIONS

CROSS-REFERENCES TO RELATED APPLICATIONS

This application claims the benefit of priority to U.S. Provisional Application No. 61/711,387, filed Oct. 9, 2012, incorporated in its entirety herein for all purposes.

STATEMENT AS TO RIGHTS TO INVENTIONS MADE UNDER FEDERALLY SPONSORED RESEARCH OR DEVELOPMENT

This invention was made with Government support under NNN12AA01C awarded by the National Aeronautics and Space Administration. The Government has certain rights in this invention.

BACKGROUND OF THE INVENTION

Thermoelectric based generators have been used successfully and reliably for the past 40 years to power deep space probes. These solid-state devices rely only on a temperature gradient to produce electricity, and are thus an attractive way of reducing our demand on fossil fuels. In order for thermoelectric devices to be used in large-scale applications, however, a number of materials problems must be overcome. For instance, the materials used in such devices are typically associated with low abundance, high cost, high toxicity, low thermal stability, and/or poor oxidation resistance.

Silicon-based thermoelectric materials are attractive candidates for large-scale applications since they are composed of abundant and low cost-elements and are relatively non-toxic. Such materials are typically associated with high thermal stability and oxidation resistance, in addition to electronic properties that are easily tunable (e.g., via doping). A problem with silicon-based thermoelectric materials, however, is that they generally have a thermal conductivity an order of magnitude too high to be an effective generator of thermoelectric power.

Earlier work investigated the impact on the lattice thermal conductivity of silicon-based materials by nanostructured inclusions. For instance, Fleurial and co-workers used a spark erosion technique to introduce small (e.g., 5 nm) inert inclusions of BN, $B_4C$, and $Y_2O_3$ into fine grained $Si_{0.80}Ge_{0.20}$ (J.-P. Fleurial et al., Nanostructured Materials, 1995, 5(2), 207-223). Although the resulting composite demonstrated a 40% reduction in the lattice thermal conductivity with an overall increase in figure of merit (ZT) of about 20%, the use of spark erosion to form such composites is impractical for large-scale applications. In particular, spark erosion is too slow, costly, involves a complex set-up, and is low yielding.

Other methods have been investigated including the mixing of pre-fabricated or synthesized metal nanoparticles and Si powders, and then compacting them using hot pressing (S. Bux et al., Advanced Functional Materials, 2009, 19, 2445-2452). However, such methods are limited by several factors in that commercially available nanoparticles are larger than the particle size required by thermoelectric models, unavailable for specific compositions and materials, and too costly. Moreover, such nanoparticles are often functionalized or contaminated with oxide or thiolated capping agents which results in contamination of the resulting composite in addition to undesirable doping effects. Other problems that arise from this approach include the agglomeration of nanoparticles into larger particles to minimize surface energy, and the settling of nanoparticles at grain boundaries as opposed to within the matrix as required by composite thermoelectric models. Such characteristics in the final composite lead to undesirable thermoelectric transport properties.

More recent work investigated the formation of silicide inclusions in silicon-based materials. For instance, Mingo and co-workers theorized that a small volume fraction of silicide inclusions in a $Si_{1-x}Ge_x$ matrix would result in an overall reduction in thermal conductivity of the silicon-germanium (N. Mingo et al., NanoLetters, 2009, 9(2), 711-715). In an approach to form such composites, Bux and co-workers used ball milling of $Si_{0.80}Ge_{0.20}$ and W (and Si and W) followed by hot pressing to form $WSi_2$ inclusions in the Si matrix; however, due to the inclusions being too large and their size distribution too broad, the resulting composite did not demonstrate a significant reduction in lattice thermal conductivity (S. Bux et al., Materials Research Society, Symposium Proceedings, 2010, 1267, 1267-DD01-06). What is needed is a nanocomposite thermoelectric material having a lattice thermal conductivity suitable for thermoelectric applications, and a method of making such a material. Surprisingly, the present invention meets this and other needs.

SUMMARY OF THE INVENTION

In one embodiment, the present invention provides a method of preparing a nanocomposite thermoelectric material. The method includes heating a reaction mixture of a semiconductor material and a metal complex to a temperature greater than the decomposition temperature of the metal complex. The heating forms metallic inclusions having a size less than about 100 nm that are substantially evenly distributed throughout the semiconductor material to form the nanocomposite thermoelectric material.

In another embodiment, the present invention provides a nanocomposite thermoelectric material. The nanocomposite thermoelectric material includes a semiconductor material comprising Si and silicide inclusions of the formula wherein M is a transition metal, and subscript x is greater than 1. The silicide inclusions have a size less than about 100 nm, and are substantially evenly distributed throughout the bulk material. The nanocomposite material has a lattice thermal conductivity of less than about 120 W/mK at a temperature of about 300-1275 K.

DETAILED DESCRIPTION OF THE INVENTION

I. General

The present invention provides a nanocomposite thermoelectric material including a silicon-based semiconductor material with substantially evenly distributed silicide inclusions. The silicide inclusions can be FeSi$_2$, WSi$_2$, or other suitable silicide, and have a size less than about 100 nm. The nanocomposite has a lattice thermal conductivity less than about 120 W/mK at a temperature of about 300-1275 K, and can be used to generate thermoelectric power.

The present invention also provides a method of making a nanocomposite thermoelectric material including evenly distributed metallic inclusions. A reaction mixture of a semiconductor material and a metal complex is heated to a temperature greater than the decomposition temperature of the metal complex. The metal complex can be an organometallic compound such as ferrocene, tungstencene, or other suitable metal complex. The heating forms inclusions having a size of less than about 100 nm that are substantially evenly distributed throughout the semiconductor material. Without being bound by any theory, a metal complex can have a higher diffusion coefficient than that of its corresponding elemental metal species, and thus the inclusions that form using a metal complex precursor have a smaller size and a narrower size distribution. The smaller particles with a narrower size distribution increase phonon scattering which results in a thermoelectric material with lower thermal conductivity.

II. Definitions

"Nanocomposite thermoelectric material" refers to a material suitable for use in thermoelectric power applications that comprises two or more constituent materials with at least one of the constituent materials having a three dimensional structure in which at least a portion of the structure displays nanometer level dimensions. The nanocomposite thermoelectric materials described herein include metallic inclusions having a size (i.e. at least one dimension) of less than about 100 nm.

"Semiconductor material" refers to a material which has an electrical conductivity between that of a metal and an insulator. Exemplary semiconductor materials include, but are not limited to, Group IV elemental semiconductors including Si, Ge and C, Group IV compound semiconductors including SiC, Group VI elemental semiconductors including S$_8$, Se and Te, Group III-V semiconductors including GaAs, GaN, GaP, GaSb, InN, InP, InAs, InSb, AlN, AlP, AlAs, AlSb, BN, BP, Bas and B$_{12}$As$_2$, Group II-VI semiconductors including CdSe, CdS, CdTe, ZnO, ZnSe, ZnS and ZnTe, Group I-VII semiconductors including CuCl, Group I-VI semiconductors including Cu$_2$S, Group IV-VI semiconductors including PbSe, PbS, PbTe, SnS, SnS$_2$, SnTe, Tl$_2$SnTe$_5$ and Tl$_2$GeTe$_5$, Group V-VI semiconductors including Bi$_2$Te$_3$, Group II-V semiconductors including Cd$_3$P$_2$, Cd$_3$As$_2$, Cd$_3$Sb$_2$, Zn$_3$P$_2$, Zn$_3$As$_2$, Zn$_3$Sb$_2$, oxide semiconductors including TiO$_2$, Cu$_2$O, CuO, UO$_2$, UO$_3$, Bi$_2$O$_3$, SnO$_2$, BaTiO$_3$, SrTiO$_3$, LiNbO$_3$ and La$_2$CuO$_4$, layered semiconductors including PbI$_2$, MoS$_2$, GaSe, SnS and Bi$_2$S$_3$, magnetic semiconductors including GaMnAs, InMnAs, CdMnTe, PbMnTe, La$_{0.7}$Ca$_{0.3}$MnO$_3$, FeO, NiO, EuO, EuS and CrBr$_3$, organic semiconductors, silicide semiconductors including Mg$_2$Si, and other semiconductors including CuInSe$_2$, ZnSiP$_2$, As$_2$S$_3$, PtSi, BiI$_3$, HgI$_2$, TlBr, Ag$_2$S, FeS$_2$ and Cu$_2$ZnSnS$_4$. Exemplary semiconductor materials also include alloy systems such as Group IV alloys including Si$_{1-x}$Ge$_x$, Group III-V alloys including Al$_x$Ga$_{1-x}$As, In$_x$Ga$_{1-x}$As, In$_x$Ga$_{1-x}$P, Al$_x$In$_{1-x}$As, Al$_x$In$_{1-x}$Sb, GaAsN, GaAsP, GaAsSb, AlGaN, AlGaP, In$_x$Ga$_{1-x}$N, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and GaInAsSbP, and Group II-VI alloys including CdZnTe, HgCdTe, HgZnTe and HgZnSe, and other alloys including CuIn$_x$Ga$_{1-x}$Se$_2$.

"Inclusion" refers to a particle comprising a first material that is embedded within a second material. The first material can be an elemental species or a compound. The inclusions described herein include metallic inclusions substantially evenly distributed throughout a semiconductor material. Metallic inclusions useful in the present invention include, but are not limited to, silicide inclusions.

"Silicide" refers to a compound comprising Si and another element. Silicides described herein include, but are not limited to, a compound comprising Si and a transition metal. Exemplary transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg and Ac. Silicides described herein may also include a compound comprising Si and an alkali metal. Exemplary alkali metals include Li, Na, K and Rb.

"Metal complex" refers to a metal atom or ion bonded to one or more molecules or anions, known as ligands. Exemplary ligands include, but are not limited to, halogens such as F, Cl, Br and I, organic ligands such as cyclopentadienyl (Cp) and porphyrin, bidentate ligands such as ethylenediamine, and carbonyl. Metal complexes useful in the present invention include, but are not limited to, organometallic compounds.

"Organometallic compound" refers to a compound comprising a metal atom and an organic molecule with a bond between the metal atom and a carbon atom of the organic molecule. Organometallic compounds useful in the present invention include metallocenes of the formula M(C$_5$H$_5$)$_2$ having two cyclopentadienyl rings bound on opposite sides of a central metal M atom, with M being a transition metal. Exemplary metallocenes include, but are not limited to, Cr(C$_5$H$_5$)$_2$, Fe(C$_5$H$_5$)$_2$, Co(C$_5$H$_5$)$_2$, Ni(C$_5$H$_5$)$_2$, Zr(C$_5$H$_5$)$_2$, Ru(C$_5$H$_5$)$_2$, Rh(C$_5$H$_5$)$_2$, Ti(C$_5$H$_5$)$_2$, V(C$_5$H$_5$)$_2$, Mo(C$_5$H$_5$)$_2$, W(C$_5$H$_5$)$_2$ and Zn(C$_5$H$_5$)$_2$. "Ferrocene" refers to Fe(C$_5$H$_5$)$_2$ and "tungstencene" refers to W(C$_5$H$_5$)$_2$.

"Lattice thermal conductivity" refers to the ability of a material to conduct heat by way of elastic vibrations (i.e. phonons) of the material lattice.

"Sintering" refers to the process of forming a material from a powder by applying pressure and heating the powder below the melting point such that the powder particles fuse together to form the material.

"Ball milling" refers to a type of mixing in which the materials to be mixed are ground in a device with a milling media to facilitate the grinding. The milling media can be any material that can freely move about the device and contact the materials to be mixed. The ball-milling device can include at least one moveable portion, often a container, that moves below a critical speed to effect movement of the milling media, which then contacts the materials and grinds them. The grinding can include both reducing the particle size, as well as fracturing the materials, and cold-welding the materials in the device to create chemical bonds.

"Hot pressing" refers to a type of pressing in which a material in powder form is placed in a mold with heat and pressure being applied simultaneously. The heat can be applied using any suitable technique such as induction heating, indirect resistance heating, and field assisted sinter technique (FAST)/direct hot pressing. The heat and pressure applied to the material can be sufficient to induce sintering of the material and creep processes.

III. Nanocomposite Thermoelectric Materials

The present invention provides a nanocomposite thermoelectric material. In some embodiments, the present invention provides a nanocomposite thermoelectric material comprising a semiconductor material including silicon and silicide inclusions of the formula $$M_{x-1}Si_x$$

wherein M is a transition metal and subscript X is greater than 1. The silicide inclusions have a size less than about 100 nm, and are substantially evenly distributed throughout the semiconductor material. The nanocomposite thermoelectric material has a lattice thermal conductivity of less than about 120 W/mK at a temperature of about 300-1275 K.

The semiconductor material can be any silicon-based semiconductor material suitable for thermoelectric applications. Suitable silicon-based semiconductor materials include, but are not limited to, Si, SiC, $Mg_2Si$, $ZnSiP_2$, PtSi and $Si_{1-y}Ge_y$. In some embodiments, the semiconductor material is Si, $Mg_2Si$ or $Si_{1-y}Ge_y$, wherein subscript y is greater than 0 and less than 1.

Metal M can be any suitable transition metal that can bond with Si to form a silicide. Suitable transition metals include V, Cr, Mn, Fe, Co, Ni, Cu, Zn, Mo, Ru, Rh, Pd, Ag, Cd, W, Re, Os, Ir, Pt, Au and Hg. In some embodiments, metal M is a Group VIB transition metal such as Cr, Mo or W, or a Group VIIIB transition metal such as Fe, Ru or Os. In other embodiments, metal M is Fe or W.

The silicides of the present invention can have any suitable value for subscript x greater than 1. In some embodiments, subscript x is 2 such that the silicide is of the formula For instance, in some embodiments, the silicide can be $FeSi_2$, $RuSi_2$, $OsSi_2$, $CrSi_2$, $MoSi_2$ or $WSi_2$. In some other embodiments, the silicide can be $FeSi_2$ or $WSi_2$.

Figure 1A:
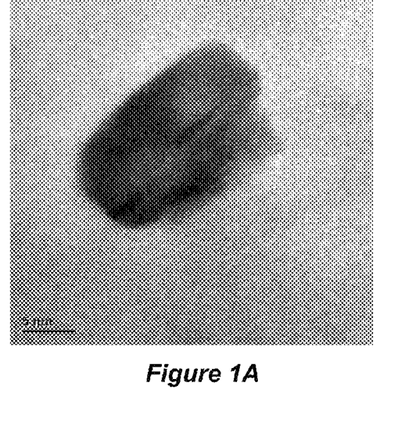
FIGS. 1A and 1B show TEM images of nanocomposite thermoelectric materials comprising Si with $FeSi_2$ inclusions. These nanocomposite thermoelectric materials were prepared using the process parameters for Si/ferrocene shown in Table 1 (see Example 1) with ball milling of the Si/ferrocene sample for 15 minutes and a hot press profile shown in FIG. 3.
Figure 1B:
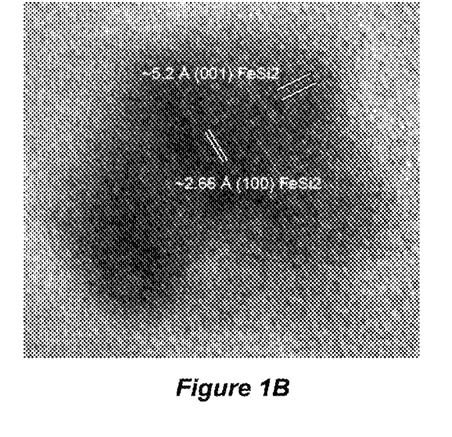

The silicide inclusions of the present invention can be very small. For instance, when $FeSi_2$ inclusions are formed within Si, the inclusions can have the size and shape shown in FIGS. 1A and 1B. In some embodiments, the silicide inclusions can have a size less than about 90, 80, 70, 60, 50, 40, 30, 20, or less than about 10 nm. In some embodiments, at least a portion of the silicide inclusions have a size less than about 2 nm.

Figure 2:
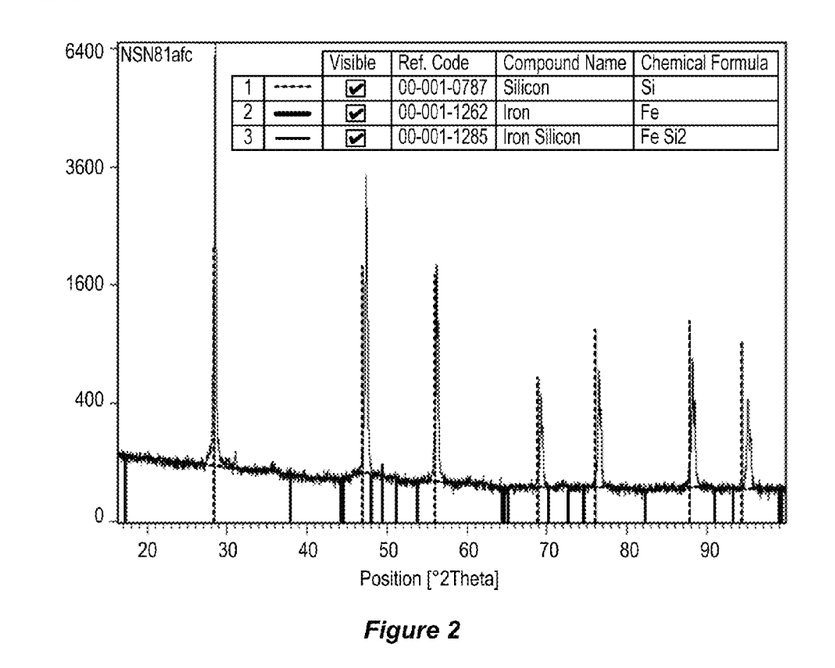
FIG. 2 shows the X-ray diffraction pattern of a nanocomposite thermoelectric material comprising Si with $FeSi_2$ inclusions. This nanocomposite thermoelectric material was prepared using the process parameters in Table 1 (see Example 1) with ball milling of the Si/ferrocene sample for 15 minutes and a hot press profile shown in FIG. 3.

The nanocomposite thermoelectric materials of the present invention can have different crystal structures depending on the selected semiconductor material and transition metal. For instance, when $FeSi_2$ inclusions are distributed throughout Si, the nanocomposite thermoelectric material can have the X-ray diffraction pattern shown in FIG. 2. In some embodiments, the silicide inclusions are substantially not located in grain boundaries of the semiconductor material, and are instead substantially located within the semiconductor material matrix. Without being bound by any theory, the mean free path of a phonon within a material is generally limited by the size of the material grain due to scattering that occurs at the grain boundary. Thus, when inclusions that cause phonon scattering are formed within the matrix of a material as opposed to at the grain boundaries, the mean free path of phonons can be further reduced which results in a lower lattice thermal conductivity than that obtained by forming inclusions at the grain boundaries.

The nanocomposite thermoelectric materials of the present invention have a lattice thermal conductivity suitable for thermoelectric power applications. In some embodiments, the lattice thermal conductivity of the nanocomposite thermoelectric material can be less than about 115, 110, 105, 100, 75 or less than 50 W/mK at a temperature of about 300-1275K.

In some embodiments, the nanocomposite thermoelectric material of the present invention comprises a semiconductor material including Si and silicide inclusions of $FeSi_2$ or $WSi_2$ that are substantially evenly distributed throughout the semiconductor material. The silicide inclusions have a size less than about 100 nm, and the nanocomposite thermoelectric material has a lattice thermal conductivity of less than about 120 W/mK at a temperature of about 300-1275 K.

IV. Method of Making Nanocomposite Thermoelectric Material

The present invention also provides a method of making a nanocomposite thermoelectric material. In some embodiments, the method includes heating a reaction mixture comprising a semiconductor material and a metal complex to a temperature greater than the decomposition temperature of the metal complex. The heating forms metallic inclusions having a size less than about 100 nm that are substantially distributed throughout the semiconductor material.

The semiconductor material can be any semiconductor material suitable for thermoelectric applications. Exemplary semiconductor materials include, but are not limited to, Group IV elemental semiconductors, Group IV compound semiconductors, Group IV alloy semiconductors, Group VI elemental semiconductors, Group III-V semiconductors, Group III-V alloy semiconductors, Group II-VI semiconductors, Group II-VI alloy semiconductors, Group I-VII semiconductors, Group I-VI semiconductors, Group IV-VI semiconductors, Group V-VI semiconductors, Group II-V semiconductors, oxide semiconductors, layered semiconductors, magnetic semiconductors including, organic semiconductors and silicide semiconductors.

In some embodiments, the semiconductor material includes Si. Exemplary silicon-based semiconductor materials include, but are not limited to, Si, SiC, $Mg_2Si$, $ZnSiP_2$, PtSi or $Si_{1-y}Ge_y$. In some embodiments, the semiconductor material is Si, $Mg_2Si$ or $Si_{1-y}Ge_y$, wherein subscript y is greater than 0 and less than 1.

The metal complex can be any metal complex suitable for obtaining the desired metallic inclusions. In some embodiments, the metal complex is an organometallic compound. For instance, the metal complex can be an organometallic compound such as a metallocene of the formula $M(C_5H_5)_2$, where M is a transition metal. Exemplary metallocenes include, but are not limited to, $Fe(C_5H_5)_2$ referred to as "ferrocene," $W(C_5H_5)_2$ referred to as "tungstencene," $Cr(C_5H_5)_2$, $Co(C_5H_5)_2$, $Ni(C_5H_5)_2$, $Zr(C_5H_5)_2$, $Ru(C_5H_5)_2$, $Rh(C_5H_5)_2$, $Ti(C_5H_5)_2$, $V(C_5H_5)_2$, $Mo(C_5H_5)_2$ and $Zn(C_5H_5)_2$. In some embodiments, the metal complex is ferrocene or tungstencene. Other suitable metal complexes include, but are not limited to, metal halides (e.g., $RuCl_3$) and organometallic porphyrins.

In some embodiments, the metal inclusions include a silicide of the formula wherein M is a transition metal and subscript X is greater than 1.

Metal M can be any suitable transition metal that can bond with Si to form a silicide. Suitable transition metals include V, Cr, Mn, Fe, Co, Ni, Cu, Zn, Mo, Ru, Rh, Pd, Ag, Cd, W, Re, Os, Ir, Pt, Au and Hg. In some embodiments, metal M is a Group VIB transition metal such as Cr, Mo or W, or a Group VIIIB transition metal such as Fe, Ru or Os. In other embodiments, metal M is Fe or W.

The silicides of the present invention can have any suitable value for subscript x greater than 1. In some embodiments, subscript x is 2 such that the silicide is of the formula For instance, in some embodiments, the silicide can be $FeSi_2$, $RuSi_2$, $OsSi_2$, $CrSi_2$, $MoSi_2$ or $WSi_2$. In some other embodiments, the silicide can be $FeSi_2$ or $WSi_2$.

The metal complex can comprise any suitable volume percentage of the reaction mixture prior to heating. In some embodiments, the metal complex comprises about 0.1 to 10% (v/v) of the reaction mixture prior to heating. In some other embodiments, the metal complex comprises about 0.1 to 8.0% (v/v), 0.1 to 6.0% (v/v), 1.0 to 6.0% (v/v), or about 1.0 to 3.0% (v/v) of the reaction mixture prior to heating.

In some embodiments, the semiconductor material is in powder form prior to heating, and the temperature can be sufficient to sinter the semiconductor material. For instance, a reaction mixture can be prepared by mixing the semiconductor material powder and the metal complex using a ball milling device, mortar and pestle, or any other suitable mixing technique. Upon preparation, the reaction mixture can be heated to a temperature sufficient to sinter the semiconductor material using a hot pressing device, spark plasma sintering (SPS), or any other suitable heating technique.

In some embodiments, the method of the present invention comprises preparing a reaction mixture by mixing a semiconductor material including Si and a metal complex of ferrocene or tungstencene using a ball milling device for about 1 to 4 hours, wherein the Si is in powder form, and wherein the metal complex comprises at about 0.1 to 10% (v/v) of the reaction mixture. The reaction mixture is then heated using a hot pressing device to a temperature of at least about 1160° C. and at a pressure of at least about 150 MPa, wherein the heating forms silicide inclusions having a size less than about 100 nm that are substantially evenly distributed throughout the semiconductor material, wherein the temperature is sufficient to sinter the semiconductor material, wherein if the metal complex is ferrocene, the silicide inclusions comprise $FeSi_2$, and wherein if the metal complex is tungstencene, the silicide inclusions comprise $WSi_2$.

The inclusions formed by the method of the present invention can be very small. For instance, when $FeSi_2$ inclusions are formed within Si, the inclusions can have the size and shape shown in FIGS. 1A and 1B. In some embodiments, the formed inclusions can have a size less than about 90, 80, 70, 60, 50, 40, 30, 20, or less than about 10 nm. In some embodiments, at least a portion of the inclusions can have a size less than about 2 nm.

As the reaction mixture is heated to a temperature above the decomposition temperature of the metal complex, the metal complex sublimes and decomposes such that the residual metal reacts with the semiconductor material to form the nanoscale inclusions. Without being bound by any theory, the metal complex has a higher diffusion coefficient than that of its corresponding elemental metal species, and thus the inclusions that form have a smaller size and a narrower size distribution than that obtainable using the elemental metal species. The smaller inclusions with a narrower size distribution increase phonon scattering which results in a thermoelectric material with lower thermal conductivity.

V. Examples

Example 1

Producing a $Si/FeSi_2$ Nanocomposite Thermoelectric Material

This example provides a method according to the present invention of producing a nanocomposite thermoelectric material comprising Si with $FeSi_2$ inclusions.

A homogenous mixture of n-type Si powder and ferrocene was prepared by high-energy ball milling. The Si powder was prepared using a procedure previously reported by Bux and co-workers (S. Bux et al., Advanced Functional Materials, 2009, 19, 2445-2452). Approximately 50 mg of ferrocene (from Sigma Aldrich) was added to approximately 3 grams of Si powder to yield approximately 1% (v/v) of ferrocene in an argon glove box. Additional Si was added to the mixture to account for a portion of the Si reacting with the ferrocene. The mixture was then removed from the argon glove box and loaded into a tungsten carbide vial and sealed. The mixture was then ball milled for 15 minutes using an SPEX mixer mill with 7/16" tungsten carbide ball bearings. Upon milling, the vial was returned to the argon glove box. The powder mixture was then loaded into 12.7 mm graphite dies and transferred to a uniaxial hot-press. The mixture was then hot-pressed up to a temperature of approximately 1160° C. and a pressure of approximately 150 MPa in accordance with the hot press profile shown in FIG. 3. The temperature and die force values shown in FIG. 3 were carefully controlled to accommodate the thermal events of ferrocene in view of its relative volatility.

A second mixture of Si and ferrocene was prepared and the above method repeated except with ball milling time modified. In particular, the second powder mixture was loaded into the mixer mill for 4 hours using the following sequence: (a) 1 hour of ball milling; (b) 1 hour with the ball mixer turned off; (c) 1 hour of ball milling; and (d) 1 hour with the ball mixer turned off.

A third mixture was prepared using the above method, except bulk Fe powder was used instead of ferrocene and different hot press conditions were utilized. In particular, the Si/bulk Fe mixture was hot-pressed up to a temperature of approximately 1160° C. and a pressure of approximately 150 MPa in accordance with the hot press profile shown in FIG. 4. As with the second mixture, the third mixture was prepared using the 4-hour ball milling sequence.

Lastly, a fourth mixture was prepared using the above method, except with a mixture comprising the Si powder and Fe nanoparticles approximately 25 nm in size. The fourth sample was hot-pressed in accordance with the hot press profile shown in FIG. 4, and ball-milled according to the 4-hour sequence applied to the second and third powder samples.

The process parameters for preparation of the four Si/FeSi$_2$ samples is summarized below in Table 1.

TABLE 1

Process Parameters for Preparation of Si/FeSi$_2$ Nanocomposite

Figure 3:
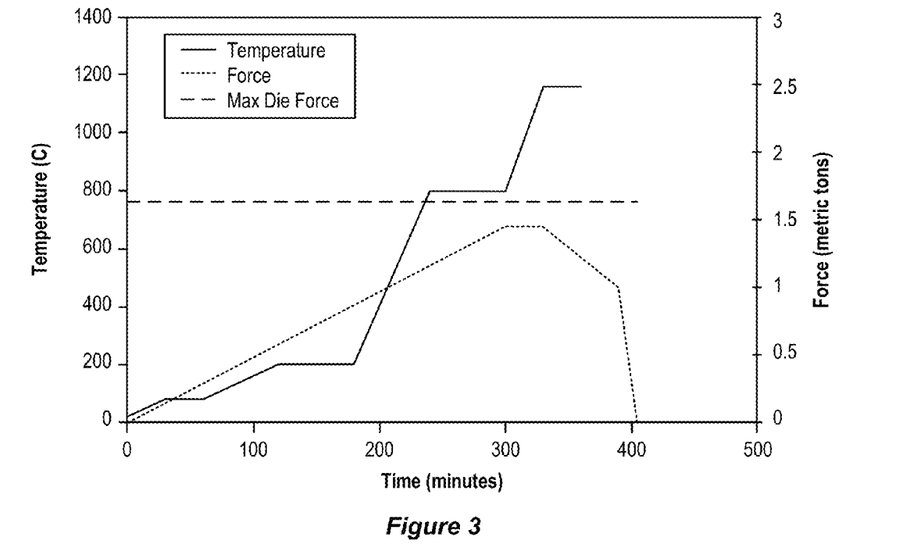
FIG. 3 shows a hot press profile according to an embodiment of the invention. The hot press profile shows the temperature and die force as a function of time as applied over time to the Si/ferrocene samples pressed in Example 1.
Figure 4:
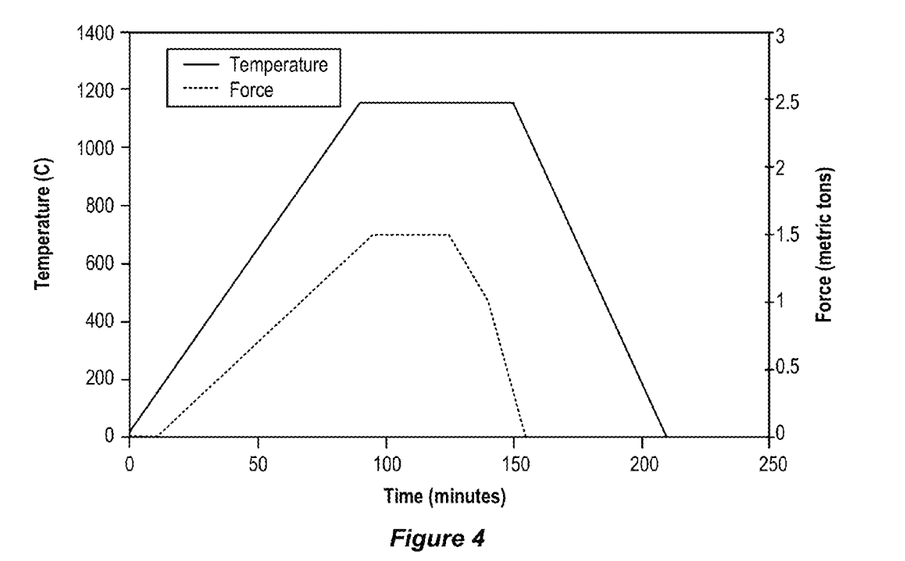
FIG. 4 shows a hot press profile according to an embodiment of the invention. The hot press profile shows the temperature and die force as a function of time as applied to the Si/Fe samples pressed in Example 1, and the Si/tungstencene and Si/W samples pressed in Example 2.

| Sample ID | % (v/v) Metal Complex/Metal | Metal Complex/Metal | Ball Milling Conditions | Press Profile |
|---|---|---|---|---|
| Sample 1 | 1 | Ferrocene | 15 minutes | FIG. 3 |
| Sample 2 | 1 | Ferrocene | 4-hour Sequence | FIG. 3 |
| Sample 3 | 1 | Bulk Fe | 4-hour Sequence | FIG. 4 |
| Sample 4 | 1 | Nano Fe (25 nm) | 4-hour Sequence | FIG. 4 |

The lattice thermal conductivity and resistivity of each hot-pressed pellet were measured at various temperatures. Additionally, for purposes of comparison, the same measurements were taken for a sample comprising only the n-type Si powder that was hot pressed in accordance with the profile of FIG. 4.

Figure 5:
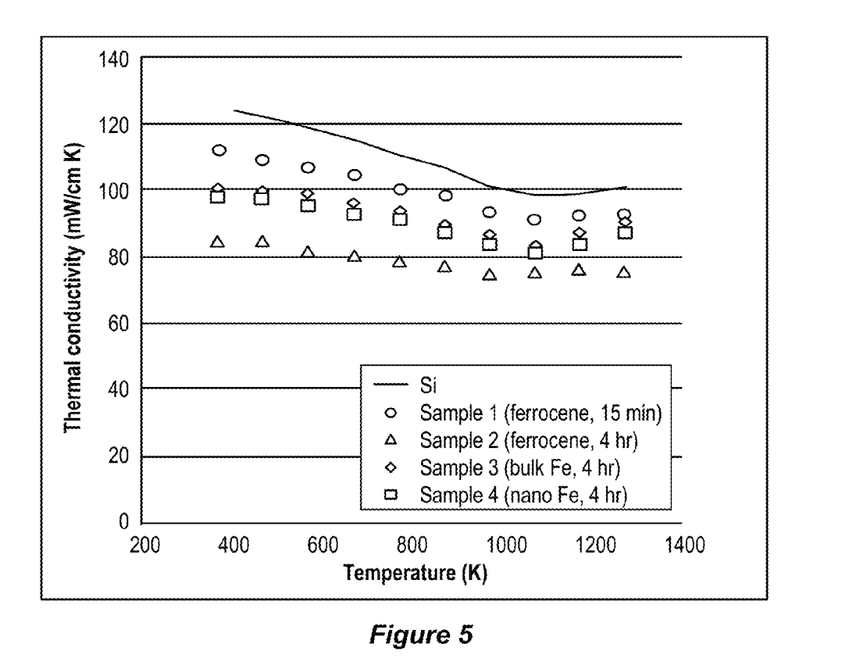
FIG. 5 shows measurements of thermal conductivity as a function of temperature for the Si/FeSi$_2$ nanocomposite thermoelectric materials prepared using the process parameters shown in Table 1 (See Example 1).
Figure 7:
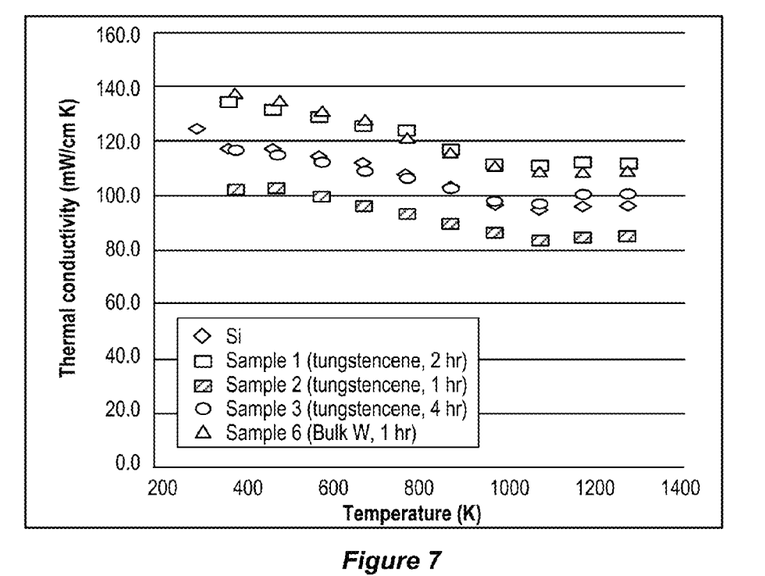
FIG. 7 shows measurements of thermal conductivity as a function of temperature for the Si/WSi$_2$ nanocomposite thermoelectric materials prepared using the process parameters shown in Table 2 (See Example 2).

FIG. 5 shows the lattice thermal conductivity as a function of temperature measured for the Si/ferrocene sample ball milled for 15 minutes, the Si/ferrocene sample ball milled for 4 hours, the Si/bulk Fe sample, the Si/nanoparticle Fe sample and the Si sample. As seen in FIG. 7, the Si/ferrocene sample ball milled for 4 hours demonstrated a significantly lower thermal conductivity than that of the Si/bulk Fe and Si/nanoparticle Fe samples, and an even more significant reduction as compared to the Si sample. The Si/ferrocene sample ball milled for 15 minutes demonstrated a thermal conductivity similar to that of the Si/bulk Fe sample. Without being bound by any theory, using a ball milling time of only 15 minutes resulted in larger FeSi$_2$ inclusions than those formed in the Si/ferrocene sample ball milled for 4 hours. The larger inclusions were less distributed and, as with the Si/bulk Fe sample, phonon scattering in the Si/ferrocene sample ball milled for 15 minutes most likely occurred predominantly at the Si grain boundaries.

Figure 6:
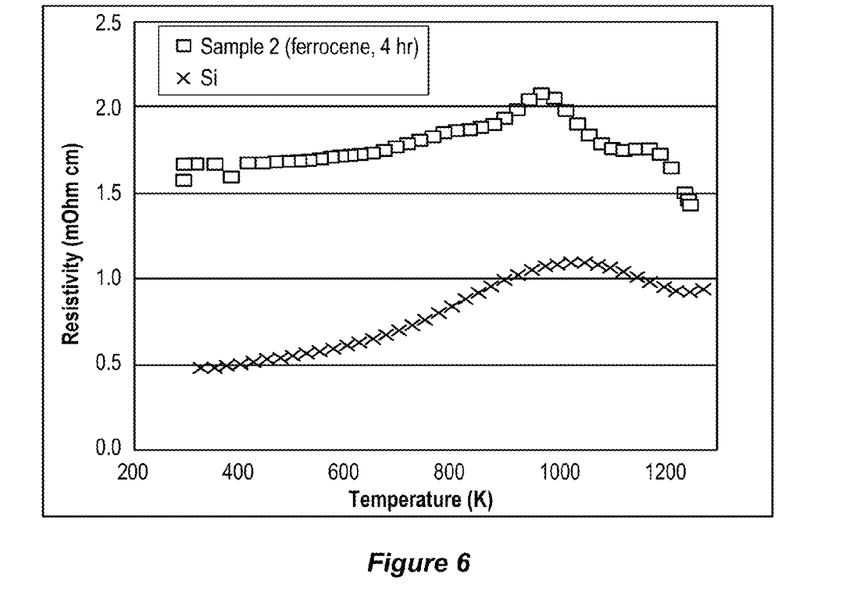
FIG. 6 shows measurements of resistivity as a function of temperature for the Si/FeSi$_2$ nanocomposite thermoelectric materials prepared using the process parameters shown in Table 1 (See Example 1).
Figure 8:
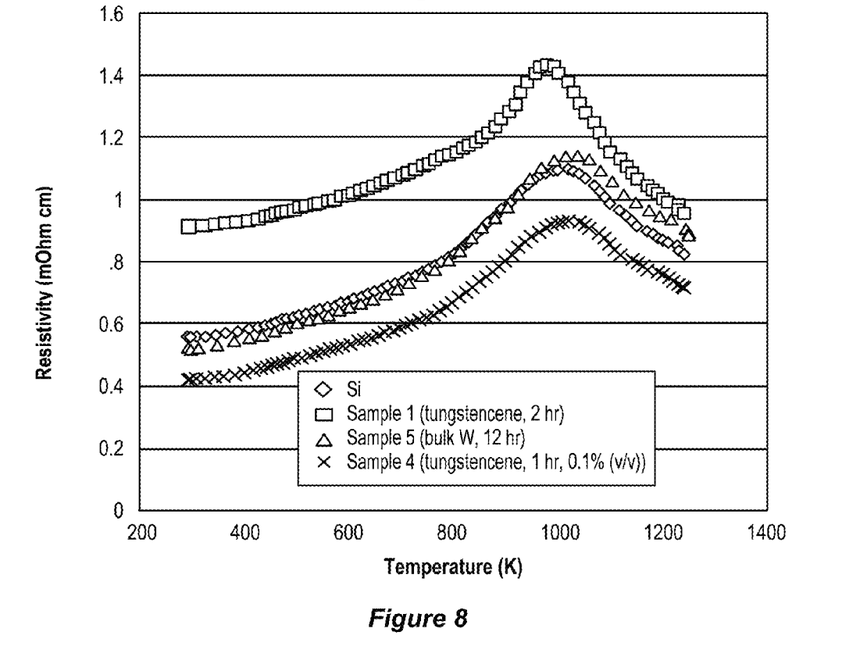
FIG. 8 shows measurements of resistivity as a function of temperature for the Si/WSi$_2$ nanocomposite thermoelectric materials prepared using the process parameters shown in Table 2 (See Example 2).

FIG. 6 shows the resistivity as a function of temperature measured for the Si/ferrocene sample ball milled for 4 hours and the Si sample. As seen in FIG. 8, the Si/ferrocene sample demonstrated a higher resistivity than that of the Si sample. Without being bound by any theory, the increase in resistivity may be due in part to the reduced electron mobility and phonon scattering, and possible phase transformations in FeSi$_2$ at higher temperatures resulting in incompatibility with the Si matrix.

Example 2

Producing a Si/WSi$_2$ Nanocomposite Thermoelectric Material

This example provides a method according to the present invention of producing a nanocomposite thermoelectric material comprising Si with WSi$_2$ inclusions.

A homogenous mixture of n-type Si powder and tungstencene was prepared by high-energy ball milling. The Si powder was prepared using a procedure previously reported by Bux and co-workers (S. Bux et al., Advanced Functional Materials, 2009, 19, 2445-2452). Approximately 50 mg of tungstencene (from Sigma Aldrich) was added to approximately 3 grams of Si powder to yield approximately 1% (v/v) of tungstencene in an argon glove box. Additional Si was added to the mixture to account for a portion of the Si reacting with the tungstencene. The mixture was then removed from the argon glove box and loaded into a tungsten carbide vial and sealed. The mixture was then ball milled for 2 hours using an SPEX mixer mill with 7/16" tungsten carbide ball bearings. Upon milling, the vial was returned to the argon glove box. The powder mixture was then loaded into 12.7 mm graphite dies and transferred to a uniaxial hot-press. The mixture was then hot-pressed up to a temperature of approximately 1160° C. and a pressure of approximately 150 MPa in accordance with the hot press profile shown in FIG. 4.

A second mixture of Si and tungstencene was prepared and the above method repeated except with ball milling time reduced to 1 hour.

A third mixture of Si and tungstencene was prepared and the above method repeated except with the ball milling time increased to 4 hours using the following sequence: (a) 1 hour of ball milling; (b) 1 hour with the ball mixer turned off; (c) 1 hour of ball milling; and (d) 1 hour with the ball mixer turned off.

A fourth mixture of Si and tungstencene was prepared and the above method repeated except with a ball milling time of 1 hour and the volume fraction of tungstencene reduced from 1 to 0.1% (v/v).

A fifth mixture was prepared using the above method, except bulk W powder (from Alpha Aesar) approximately 3-4 microns in size was used instead of tungstencene, and the sample was ball milled for 12 hours.

Lastly, a sixth mixture was prepared using the bulk W powder and a ball milling time of 1 hour.

The process parameters for preparation of the six Si/WSi$_2$ samples is summarized below in Table 2.

TABLE 2

Process Parameters for Preparation of Si/WSi$_2$ Nanocomposite

| Sample ID | % (v/v) Metal Complex/Metal | Metal Complex/Metal | Ball Milling Conditions | Press Profile |
|---|---|---|---|---|
| Sample 1 | 1 | Tungstencene | 2 hours | FIG. 4 |
| Sample 2 | 1 | Tungstencene | 1 hour | FIG. 4 |
| Sample 3 | 1 | Tungstencene | 4-hour Sequence | FIG. 4 |
| Sample 4 | 0.1 | Tungstencene | 1 hour | FIG. 4 |
| Sample 5 | 1 | Bulk W | 12 hours | FIG. 4 |
| Sample 6 | 1 | Bulk W | 1 hour | FIG. 4 |

The lattice thermal conductivity and resistivity of each hot-pressed pellet were measured at various temperatures. Additionally, for purposes of comparison, the same measurements were taken for a sample comprising only the n-type Si powder that was hot pressed in accordance with the profile of FIG. 4.

FIG. 7 shows the lattice thermal conductivity as a function of temperature measured for the Si/tungstencene 1% (v/v) samples ball milled for 1, hour, 2 hours and 4 hours, the Si/bulk W sample ball milled for 1 hour and the Si sample. As seen in FIG. 7, the Si/tungstencene sample ball milled for 1 hour demonstrated a significantly lower thermal conductivity than that of the Si/bulk W sample, and an even more significant reduction as compared to the Si sample. Additionally, the Si/tungstencene sample ball milled for 4 hours demonstrated a lower thermal conductivity than the Si/bulk W sample over temperatures over 1000 K.

FIG. 8 shows the resistivity as a function of temperature measured for the Si/tungstencene 1% (v/v) sample ball milled for 1 hour, the Si/tungstencene 0.1% (v/v) sample ball milled for 1 hour, the Si/bulk W sample ball milled for 12 hours and the Si sample. As seen in FIG. 8, the Si/tungstencene 0.1% (v/v) sample demonstrated a resistivity lower than that of the Si sample, and the Si/tungstencene 1% (v/v) sample demonstrated a resistivity only slightly higher than that of the Si sample, particularly at temperatures of 800 K and higher. Without being bound by any theory, as compared to the Si/FeSi$_2$ nanocomposite prepared in Example 1, the resistivity of the Si/WSi$_2$ nanocomposite may be closer to that of Si since the WSi$_2$ inclusions resist decomposition and phase transformations at high temperatures due to refractory phases being predominant in the W—Si phase diagram.

Although the foregoing invention has been described in some detail by way of illustration and example for purposes of clarity of understanding, one of skill in the art will appreciate that certain changes and modifications can be practiced within the scope of the appended claims. In addition, each reference provided herein is incorporated by reference in its entirety to the same extent as if each reference was individually incorporated by reference. Where a conflict exists between the instant application and a reference provided herein, the instant application shall dominate.

What is claimed is:

1. A method of preparing a nanocomposite thermoelectric material comprising:
heating a reaction mixture comprising a semiconductor material and a metal complex to a temperature greater than the decomposition temperature of the metal complex, wherein the semiconductor material comprises Si, wherein the metal complex comprises a transition metal, wherein the heating initiates a reaction between the transition metal and the semiconductor material that forms metallic inclusions having a size less than about 100 nm that are substantially evenly distributed throughout the semiconductor material, and wherein the metallic inclusions comprise a silicide of the formula $$M_{x-1}Si_x$$

wherein
M is the transition metal, and
subscript x is greater than 1,
thereby preparing the nanocomposite thermoelectric material.

2. The method of claim 1, wherein the semiconductor material is selected from the group consisting of Si, Mg$_2$Si and Si$_{1-y}$Ge$_y$, wherein subscript y is greater than 0 and less than 1.

3. The method of claim 1, wherein the metal complex is an organometallic compound.

4. The method of claim 3, wherein the organometallic compound is selected from the group consisting of ferrocene and tungstencene.

5. The method of claim 1, wherein subscript x is 2.

6. The method of claim 1, wherein M is selected from the group consisting of Fe and W.

7. The method of claim 1, wherein the silicide is selected from the group consisting of FeSi$_2$ and WSi$_2$.

8. The method of claim 1, wherein the metal complex comprises about 0.1 to 10% (v/v) of the reaction mixture prior to heating.

9. The method of claim 1, wherein the semiconductor material is in powder form prior to heating, and wherein the temperature is sufficient to sinter the semiconductor material.

10. The method of claim 1, wherein the method comprises:
preparing the reaction mixture by mixing the semiconductor material comprising Si and the metal complex using a ball milling device for about 1 to 4 hours, wherein the metal complex is selected from the group consisting of ferrocene and tungstencene, wherein the semiconductor material is in powder form, and wherein the metal complex comprises about 0.1 to 10% (v/v) of the reaction mixture; and
heating the reaction mixture using a hot pressing device to a temperature of at least about 1160° C. and at a pressure of at least about 150 MPa, wherein the heating forms the metallic inclusions comprising the silicide having a size less than about 100 nm that are substantially evenly distributed throughout the semiconductor material, wherein the temperature is sufficient to sinter the semiconductor material, wherein if the metal complex is ferrocene, the silicide is FeSi$_2$, and wherein if the metal complex is tungstencene, the silicide is WSi$_2$, thereby preparing the nanocomposite thermoelectric material.

11. A nanocomposite thermoelectric material comprising:
a semiconductor material comprising Si; and
silicide inclusions of the formula $$M_{x-1}Si_x$$

wherein
M is a transition metal, and
subscript x is greater than 1,
wherein the silicide inclusions have a size less than about 100 nm, wherein the silicide inclusions are substantially evenly distributed within grains of the semiconductor material, and wherein the nanocomposite thermoelectric material has a lattice thermal conductivity of less than about 120 W/mK at a temperature of about 300-1275 K.

12. The nanocomposite thermoelectric material of claim 11, wherein the semiconductor material is selected from the group consisting of Si, Mg$_2$Si and Si$_{1-y}$Ge$_y$, wherein subscript y is greater than 0 and less than 1.

13. The nanocomposite thermoelectric material of claim 11, wherein subscript x is 2.

14. The nanocomposite thermoelectric material of claim 11, wherein M is selected from the group consisting of Fe and W.

15. The nanocomposite thermoelectric material of claim 11, wherein the silicide is selected from the group consisting of FeSi$_2$ and WSi$_2$.

16. The nanocomposite thermoelectric material of claim 11, wherein the silicide inclusions are substantially not located in grain boundaries of the semiconductor material.

17. The nanocomposite thermoelectric material of claim 11, wherein at least a portion of the silicide inclusions have a size less than about 2 nm.

18. The nanocomposite thermoelectric material of claim 11, wherein the nanocomposite thermoelectric material comprises:
the semiconductor material comprising Si; and
the silicide inclusions, wherein the silicide inclusions are selected from the group consisting of FeSi$_2$ and WSi$_2$, wherein the silicide inclusions have a size less than about 100 nm, wherein the silicide inclusions are substantially evenly distributed within grains of the semiconductor material, and wherein the nanocomposite thermoelectric material has the lattice thermal conductivity of less than about 120 W/mK at a temperature of about 300-1275 K.

* * * * *